US011106123B2

(12) United States Patent
Tsai et al.

(10) Patent No.: US 11,106,123 B2
(45) Date of Patent: Aug. 31, 2021

(54) WAVELENGTH-CONVERTING COMPONENT, PROJECTION APPARATUS AND MANUFACTURING METHOD OF THE WAVELENGTH-CONVERTING COMPONENT

(71) Applicant: Coretronic Corporation, Hsin-Chu (TW)

(72) Inventors: Yu-Lin Tsai, Hsin-Chu (TW); Wei-Hua Kao, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/503,634

(22) Filed: Jul. 5, 2019

(65) Prior Publication Data

US 2020/0012179 A1    Jan. 9, 2020

(30) Foreign Application Priority Data

Jul. 9, 2018  (CN) .......................... 201810743473.9

(51) Int. Cl.
*G03B 21/42* (2006.01)
*H01L 33/50* (2010.01)
(Continued)

(52) U.S. Cl.
CPC ............ *G03B 21/42* (2013.01); *C09J 179/08* (2013.01); *G02B 26/008* (2013.01);
(Continued)

(58) Field of Classification Search
CPC .... G03B 21/42; G03B 21/204; H04N 9/3114; H01L 33/502; H01L 33/46; G02B 26/008
(Continued)

(56) References Cited

U.S. PATENT DOCUMENTS 4,065,345 A * 12/1977 Progar ............... C08G 73/1032
156/307.5
6,492,031 B1   12/2002 Moriyama et al.
(Continued)

FOREIGN PATENT DOCUMENTS

CN         1825183 A      8/2006
CN       101151302 A      3/2008
(Continued)

OTHER PUBLICATIONS

Davis et al., Silver-polyimide nanocomposite membranes: Macromolecular-matrix-mediated metallization of an aromatic, fluorinated polyimide yielding highly reflective films at low metal concentrations Nov. 22, 2006, Journal of Applied Polymer Science vol. 103, Issue 4. https://doi.org/10.1002/app.25384 (Year: 2006).*

*Primary Examiner* — Christopher E Mahoney

(57) ABSTRACT

A wavelength-converting component includes a substrate, a wavelength-converting layer and a reflective layer. The wavelength-converting layer is disposed on the substrate. The reflective layer is disposed between the substrate and the wavelength-converting layer. The reflective layer includes a plurality of diffuse reflection particles and a first organic adhesive. The diffuse reflection particles are mixed in the first organic adhesive. The first organic adhesive includes an aromatic polyimide. The invention further provides a projection apparatus using the wavelength-converting component and provides a manufacturing method of the wavelength-converting component. The wavelength-converting component of the invention can improve mechanical properties such as shear strength, tensile strength and fatigue strength, temperature resistance and reflectivity, and can reduce rates of moisture absorption. The projection apparatus of the invention can reduce degradation in image brightness.

9 Claims, 6 Drawing Sheets

(51) Int. Cl.
*H04N 9/31* (2006.01)
*H01L 33/46* (2010.01)
*H01L 33/40* (2010.01)
*C09J 179/08* (2006.01)
*C08G 73/10* (2006.01)
*G02B 26/00* (2006.01)

(52) U.S. Cl.
CPC ............ *H01L 33/405* (2013.01); *H01L 33/46* (2013.01); *H01L 33/502* (2013.01); *H04N 9/3114* (2013.01); *C08G 73/1007* (2013.01)

(58) Field of Classification Search
USPC .......................................................... 353/84
See application file for complete search history.

(56) References Cited

U.S. PATENT DOCUMENTS

| | | | | |
|---|---|---|---|---|
| 9,874,741 | B2* | 1/2018 | Egawa | ................. G03B 21/204 |
| 2006/0203347 | A1* | 9/2006 | Yang | ................... G02B 5/0215 |
| | | | | 359/599 |
| 2007/0048499 | A1* | 3/2007 | Wu | ....................... G02B 5/0808 |
| | | | | 428/143 |
| 2007/0292709 | A1 | 12/2007 | Oishi et al. | |
| 2014/0137734 | A1 | 5/2014 | Liu et al. | |
| 2016/0123557 | A1* | 5/2016 | Xu | ......................... C09K 11/02 |
| | | | | 362/84 |
| 2017/0326790 | A1* | 11/2017 | Lee | ........................ B33Y 80/00 |
| 2019/0199981 | A1* | 6/2019 | Murakami | ........... G03B 21/008 |

FOREIGN PATENT DOCUMENTS

| | | |
|---|---|---|
| CN | 101609863 A | 12/2009 |
| CN | 101784917 A | 7/2010 |
| CN | 101852948 A | 10/2010 |
| CN | 104749908 A | 7/2015 |
| CN | 105738994 A | 7/2016 |
| CN | 107615172 A | 1/2018 |
| EP | 3001246 A1 | 3/2016 |
| TW | I310042 B | 5/2009 |
| TW | 201433832 A | 9/2014 |
| TW | I524130 B | 3/2016 |

* cited by examiner

WAVELENGTH-CONVERTING COMPONENT, PROJECTION APPARATUS AND MANUFACTURING METHOD OF THE WAVELENGTH-CONVERTING COMPONENT

CROSS-REFERENCE TO RELATED APPLICATION

This application claims the priority benefit of China application 201810743473.9, filed on Jul. 9, 2018. The entirety of the above-mentioned patent application is hereby incorporated by reference herein and made a part of this specification.

FIELD OF THE INVENTION

The invention relates to a display apparatus, and more particularly to a wavelength-converting component, a projection apparatus using the wavelength-converting component and a manufacturing method of the wavelength-converting component.

BACKGROUND OF THE INVENTION

With the market requirements for projection apparatus in brightness, color saturation, service life, non-toxic environmental protection, etc., the types of light sources used in the projection apparatus have evolved from a UHP lamp, a light emitting diode (LED) to a laser diode (LD).

At present, the cost of high-brightness red laser diodes and green laser diodes is too high. In order to reduce the cost, a blue laser diode is used to excite the phosphor powder on the phosphor wheel to generate yellow light and green light, and then the desired red light is filtered out by a filter wheel. Together with the blue light emitted by the blue laser diode, the three primary colors of red, green and blue required for the projection image are generated.

The phosphor wheel is an extremely important component of the projection apparatus using a laser diode as a light source currently. However, the conventional phosphor wheel uses a highly transparent silica gel mixed with phosphor powder or reflective material. Due to the poor thermal conductivity and low temperature resistance of the highly transparent silica gel, it cannot satisfy the demand of high-power laser projection apparatus. If a glass-based material mixed with phosphor powder or a reflective material is used instead, although the above-mentioned disadvantages can be reduced, the glass-based material is required to perform heat curing at a high temperature greater than 400° C., and the glass-based material after curing has more pores, which may affect the thermal conductivity of the material, and the pores may absorb liquids, which may also affect the material selection of subsequent manufacturing process of the phosphor wheel.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a wavelength-converting component, which can improve mechanical properties such as shear strength, tensile strength and fatigue strength, temperature resistance and reflectivity, and can reduce rates of moisture absorption.

The invention provides a manufacturing method of a wavelength-converting component, which can improve mechanical properties such as shear strength, tensile strength and fatigue strength, temperature resistance and reflectivity, and can reduce rates of moisture absorption of the wavelength-converting component.

The invention provides a projection apparatus, which can reduce degradation in image brightness.

Other advantages and objects of the invention may be further illustrated by the technical features broadly embodied and described as follows.

In order to achieve one or a portion of or all of the objects or other objects, a wavelength-converting component provided by an embodiment of the invention includes a substrate, a wavelength-converting layer and a reflective layer. The wavelength-converting layer is disposed on the substrate. The reflective layer is disposed between the substrate and the wavelength-converting layer. The reflective layer includes a plurality of diffuse reflection particles and a first organic adhesive. The diffuse reflection particles are mixed in the first organic adhesive. The first organic adhesive includes an aromatic polyimide.

In order to achieve one or a portion of or all of the objects or other objects, a projection apparatus provided by an embodiment of the invention includes an illumination system, a light valve and a projection lens. The illumination system is configured to provide an illumination beam. The light valve is disposed on a transmission path of the illumination beam to convert the illumination beam into an image beam. The projection lens is disposed on a transmission path of the image beam. The illumination system includes an excitation light source and the wavelength-converting component. The excitation light source is configured to provide an excitation beam. The wavelength-converting component is disposed on a transmission path of the excitation beam. The wavelength-converting layer of the wavelength-converting component is configured to convert the excitation beam into a converted beam, and the illumination beam includes the converted beam.

In order to achieve one or a portion of or all of the objects or other objects, a manufacturing method of a wavelength-converting component provided by an embodiment of the invention includes: providing a substrate, wherein the substrate has a first surface and a second surface opposite to the first surface; providing a wavelength-converting layer, wherein the wavelength-converting layer has a third surface and a fourth surface opposite to the third surface, and the third surface of the wavelength-converting layer faces the second surface of the substrate; and providing a reflective layer, wherein the reflective layer has a fifth surface and a sixth surface opposite to the fifth surface, and the reflective layer is located between the second surface of the substrate and the third surface of the wavelength-converting layer. The fifth surface faces the second surface of the substrate, and the sixth surface faces the third surface of the wavelength-converting layer. The reflective layer includes a plurality of diffuse reflection particles and a first organic adhesive, and the diffuse reflection particles are mixed in the first organic adhesive. The first organic adhesive includes an aromatic polyimide, and the method for providing the reflective layer includes forming the reflective layer on a forming surface by performing heat curing.

In order to achieve one or a portion of or all of the objects or other objects, a manufacturing method of a wavelength-converting component provided by an embodiment of the invention includes: providing a substrate; providing a reflective layer disposed on the substrate; and providing a wavelength-converting layer disposed on a surface of the reflective layer away from the substrate. The wavelength-converting layer includes a wavelength-converting material and a second organic adhesive, and the wavelength-converting material is mixed in the second organic adhesive. The second organic adhesive includes an aromatic polyimide. A method for providing the wavelength-converting layer includes forming the wavelength-converting layer on a surface of the reflective layer away from the substrate by performing heat curing.

In the wavelength-converting component of the embodiments of the invention, the reflective layer includes a first organic adhesive and diffuse reflection particles. The first organic adhesive includes an aromatic polyimide. Since curing temperatures of the first organic adhesive using the above formula are only from 200° C. to 300° C., compared to the curing temperature of conventional glass-based material required to be greater than 400° C., the reflective layer of the embodiments of the invention can reduce the fine pores generated by sintering at a high temperature (>400° C.) and the characteristics of easily adsorbing liquids. The curing process where the temperature is increased in stages, can improve mechanical properties such as shear strength, tensile strength and fatigue strength of the entire structure of the reflective layer. In addition, chemical stability of the benzene ring structure contained in the aromatic polyimide is higher, which also contributes to the improvement of the mechanical properties such as shear strength, tensile strength and fatigue strength of the entire structure of the reflective layer, and can improve the temperature resistance. The aromatic structure has hydrophobic properties, which can also reduce rates of moisture absorption. The manufacturing method of the wavelength-converting component of the embodiments of the invention uses the above-mentioned first organic adhesive. Therefore, the above-mentioned wavelength-converting component can be produced. The projection apparatus of the embodiment of the invention can reduce degradation in image brightness by using the above-mentioned wavelength-converting component.

Other objectives, features and advantages of The invention will be further understood from the further technological features disclosed by the embodiments of The invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces", and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1A:
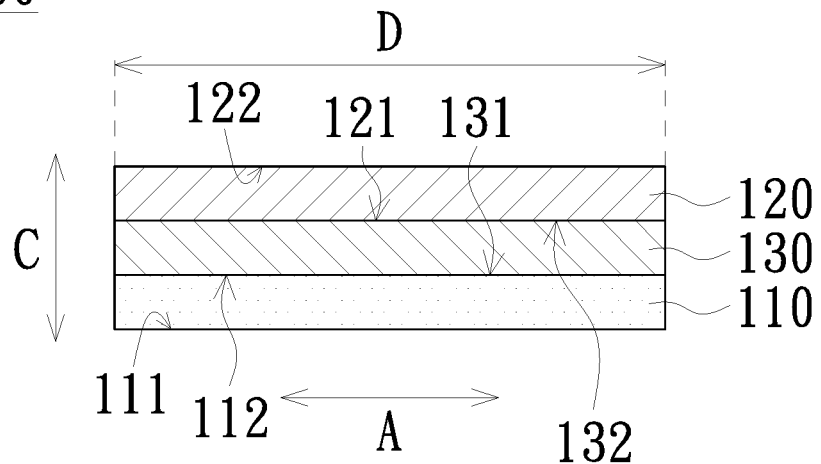
FIG. 1A is a schematic view of a wavelength-converting component according to an embodiment of the invention.

FIG. 1A is a schematic view of a wavelength-converting component according to an embodiment of the invention. Please refer to FIG. 1A. A wavelength-converting component 100 of the embodiment includes a substrate 110, a wavelength-converting layer 120 and a reflective layer 130. The wavelength-converting component 100 is, for example, a sheet-like component, but is not limited thereto. In other embodiments, the wavelength-converting component 100 may also be a wavelength-converting wheel, and the substrate 110 is, for example, a turntable. The wavelength-converting layer 120 is disposed on the substrate 110. The reflective layer 130 is disposed between the substrate 110 and the wavelength-converting layer 120. The reflective layer 130 includes, for example, a plurality of diffuse reflection particles and a first organic adhesive. The diffuse reflection particles are mixed in the first organic adhesive. The first organic adhesive includes an aromatic polyimide, and curing temperatures of the first organic adhesive are from 200° C. to 300° C.

A material of the substrate 110 is, for example, a metal, but is not limited thereto, and the metal includes, for example, aluminum, an aluminum alloy, copper, a copper alloy, aluminum nitride, silicon carbide, etc.

A material of the diffuse reflection particles is, for example, white particles, and includes at least one of titanium dioxide, silicon dioxide, aluminum oxide, boron nitride and zirconium dioxide.

In an embodiment of FIG. 1A, the wavelength-converting layer 120 includes, for example, a wavelength-converting material and an adhesive. The wavelength-converting material is mixed with the adhesive. The wavelength-converting material is, for example, a phosphor or quantum dots. The adhesive may be a second organic adhesive or an inorganic adhesive. The ingredients of the second organic adhesive are, for example, the same as the first organic adhesive. That is, the second organic adhesive includes an aromatic polyimide, and curing temperatures of the second organic adhesive are from 200° C. to 300° C., and the inorganic adhesive includes, for example, at least one of a glass paste, a water glass and a silica gel.

Figure 1B:
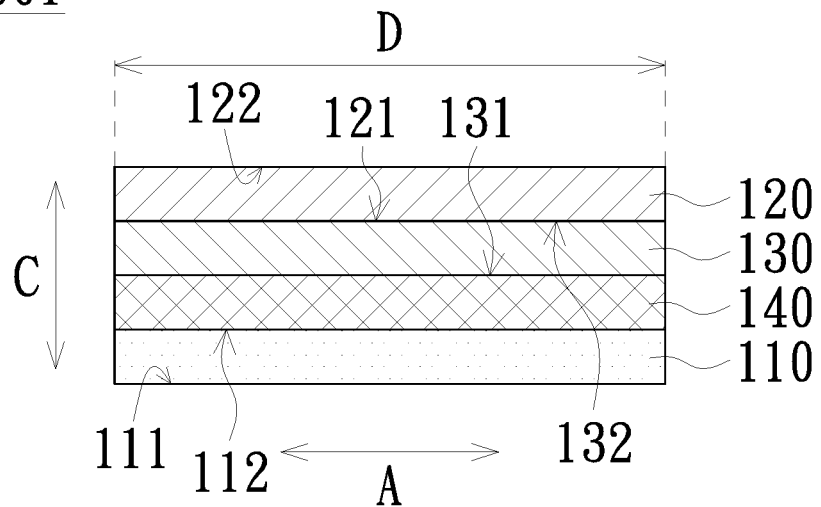
FIG. 1B is a schematic view of a wavelength-converting component according to another embodiment of the invention.

FIG. 1B is a schematic view of a wavelength-converting component according to another embodiment of the invention. Please refer to FIG. 1B. The structure of the wavelength-converting component 1001 of the embodiment is similar to the structure of the wavelength-converting component 100 of the embodiment in FIG. 1A. The difference is that the wavelength-converting component 1001 further includes, for example, an intermediate layer 140 disposed between the substrate 110 and the reflective layer 130. The intermediate layer 140 is configured to bond the substrate 110 and the reflective layer 130 in the manufacturing process of the wavelength-converting component 1001. A material of the intermediate layer 140 includes, for example, a silica gel, an epoxy resin or a thermally conductive adhesive. The thermally conductive adhesive is further configured to assist the reflective layer 130 to conduct heat. When the thermally conductive adhesive is used as the intermediate layer 140, a thermal conductivity of the reflective layer 130 is required to be less than or equal to a thermal conductivity of the intermediate layer 140, so that the heat generated by the high energy of an incident light can be conducted by the thermally conductive adhesive to achieve a heat dissipation effect. In addition, the thermally conductive adhesive can further be used as a sheet-like thermally conductive patch in addition to being coated in a liquid form. In an embodiment of FIG. 1B, the wavelength-converting layer 120 includes, for example, a phosphor in glass, a phosphor in ceramic, a polycrystalline fluorescent sheet, a monocrystalline fluorescent sheet or a phosphor in silicon, but is not limited thereto. In another embodiment of FIG. 1B, the wavelength-converting layer 120 includes, for example, a wavelength-converting material and an adhesive. The wavelength-converting material is mixed in the adhesive. The wavelength-converting material and the adhesive of the embodiment are, for example, the wavelength-converting material and the adhesive of the embodiment in FIG. 1A, but are not limited thereto.

Figure 2:
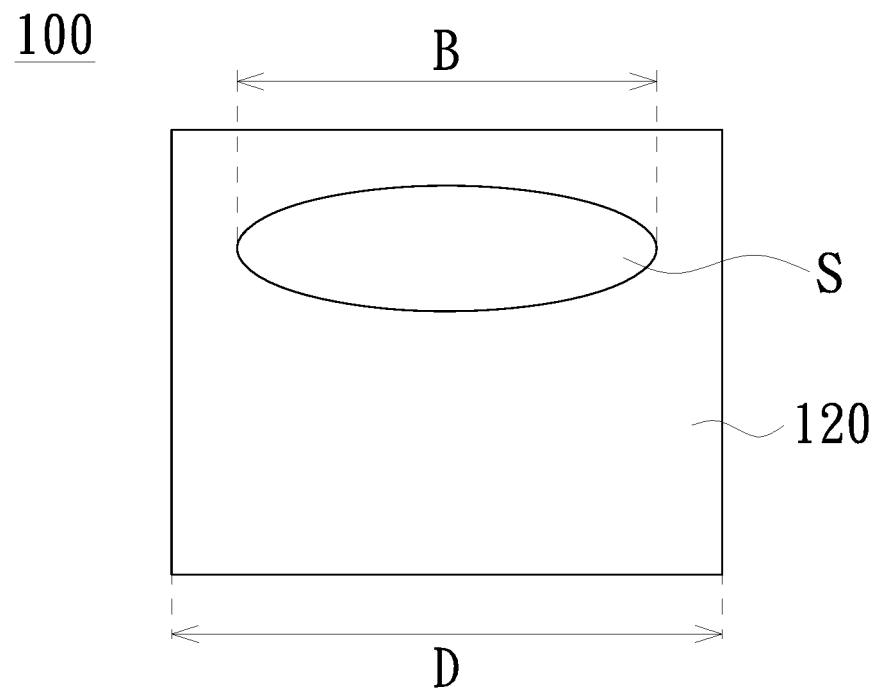
FIG. 2 is a schematic view of a light spot formed by a light on a wavelength-converting component according to an embodiment of the invention.

FIG. 2 is a schematic view of a light spot formed by a light on a wavelength-converting component according to an embodiment of the invention. Please refer to FIG. 1A, 1B and FIG. 2. When the wavelength-converting layer 120 and the reflective layer 130 are disposed on the substrate 110, the widths D of the wavelength-converting layer 120 and the reflective layer 130 in the direction A parallel to the substrate 110 (the widths of the two layers are the same in the embodiment, therefore only D represents the widths of the two layers) are required to be greater than a long axis B of a light spot S formed by a light irradiated on the wavelength-converting components 100, 1001 (FIG. 2 is illustrated by the wavelength-converting component 100 of FIG. 1A and the uppermost wavelength-converting layer 120), so that a light can be irradiated on the wavelength-converting components 100, 1001 to improve the utilization of light.

Figure 3:
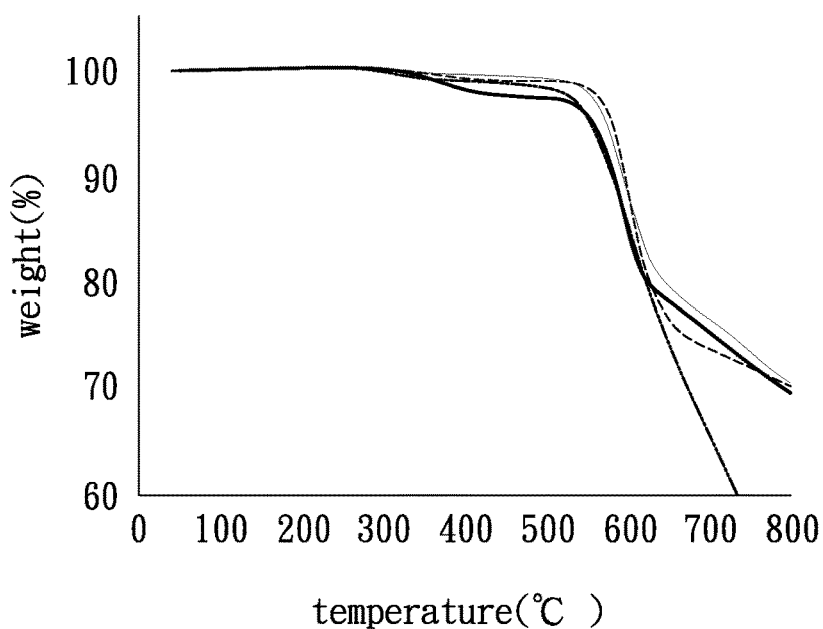
FIG. 3 is a schematic view showing the results of thermogravimetric analysis of an aromatic polyimide according to an embodiment of the invention.

In the wavelength-converting components 100, 1001 of the embodiments of FIG. 1A and FIG. 1B, the reflective layer 130 includes a first organic adhesive and diffuse reflection particles. The first organic adhesive includes an aromatic polyimide. Since curing temperatures of the first organic adhesive using the above formula are only from 200° C. to 300° C., compared to the curing temperature of the conventional glass-based material, which is greater than 400° C., the reflective layer 130 of the embodiment of the invention can reduce the fine pores generated by sintering at a high temperature (>400° C.) and the characteristics of easily adsorbing liquids. The curing process where the temperature is increased in stages, can improve mechanical properties such as shear strength, tensile strength and fatigue strength of the entire structure of the reflective layer 130. In addition, chemical stability of the benzene ring structure contained in the aromatic polyimide is higher, which also helps to improve the mechanical properties such as shear strength, tensile strength and fatigue strength of the entire structure of the reflective layer 130, and can improve temperature resistance. As shown in thermogravimetric analysis results of FIG. 3, a pyrolysis temperature of the aromatic polyimide is higher than 500° C., and the aromatic structure has a hydrophobic property and can also reduce rates of moisture absorption. According to the experimental analysis, a water absorption result of the aromatic polyimide is less than 0.5%, and the water vapor transmission rate is less than 0.1 g/day/m2.

Figure 4:
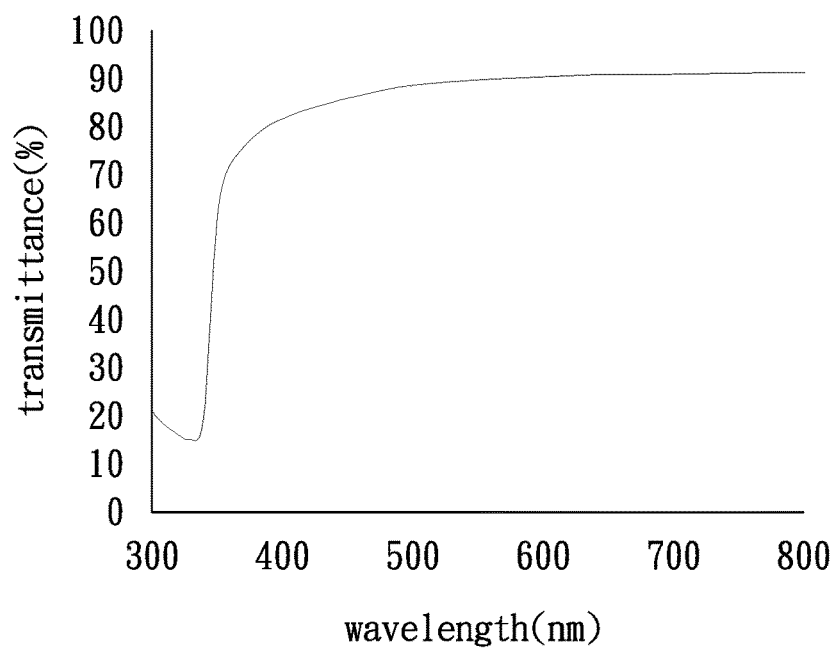
FIG. 4 is a schematic view showing the results of the light transmittance of the aromatic polyimide according to an embodiment of the invention.

Since the reflective layer 130 of the embodiment can reduce the fine pores generated by sintering at a high temperature, and the aromatic polyimide has a transmittance greater than 90% for a light having a wavelength in a visible light region (550 nm), as the result shown in FIG. 4, the light is more easily reflected by the diffuse reflection particles when it is incident on the reflective layer 130, so that reflectivity of the wavelength-converting components 100, 1001 can also be improved. In the embodiment, the reflective layer 130 has a reflectivity greater than or equal to 92% for a light having a wavelength from 400 nm to 700 nm. In order to achieve a better diffuse reflection effect, the thickness of the reflective layer 130 in the direction C perpendicular to the substrate 110 is, for example, from 0.03 mm to 0.15 mm. The particle diameters of the diffuse reflection particles are, for example, from 5 nm to 500 nm. In addition, the volume ratio of the first organic adhesive to the reflective layer 130 is, for example, from 25% to 75%. When a ratio of the first organic adhesive is too low, the diffuse reflection particles are easily detached. When a ratio of the first organic adhesive is too high, the diffuse reflection effect may be affected.

Figure 5:
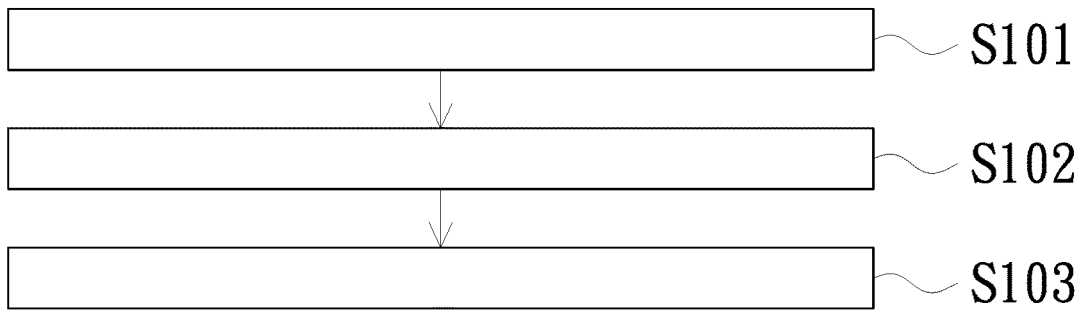
FIG. 5 is a schematic flow chart showing a manufacturing method of a wavelength-converting component according to an embodiment of the invention.

FIG. 5 is a schematic flow chart showing a manufacturing method of a wavelength-converting component according to an embodiment of the invention. Please refer to FIG. 1A, FIG. 1B and FIG. 5. The manufacturing method of the wavelength-converting components 100, 1001 of the embodiment includes the following steps: the step S101 is performed to provide a substrate 110, wherein the substrate 110 has a first surface 111 and a second surface 112 opposite to the first surface 111.

The step S102 is performed to provide a wavelength-converting layer 120, wherein the wavelength-converting layer 120 has a third surface 121 and a fourth surface 122 opposite to the third surface 121, and the third surface 121 of the wavelength-converting layer 120 faces the second surface 112 of the substrate 110.

The step S103 is performed to provide a reflective layer 130, wherein the reflective layer 130 has a fifth surface 131 and a sixth surface 132 opposite to the fifth surface 131. The reflective layer 130 is located between the second surface 112 of the substrate 110 and the third surface 121 of the wavelength-converting layer 120, wherein the fifth surface 131 faces the second surface 112 of the substrate 110, and the sixth surface 132 faces the third surface 121 of the wavelength-converting layer 120. In particular, the method for providing the reflective layer 130 includes, for example, performing heat curing at temperatures from 200° C. to 300° C. after the reflective layer 130 is coated on the forming surface. The different methods for providing the reflective layer 130 are exemplified below.

In the step S103, a specific method of an embodiment for providing the reflective layer 130 is, for example, to synthesize an aromatic polyimide, and to mix a plurality of diffuse reflection particles, the aromatic polyimide and an organic solvent, to coat on a forming surface, and to perform heat curing. Ingredients of the organic solvent include, for example, N-Methyl-2-Pyrrolidone (NMP), dimethylformamide (DMF), dimethylacetamide (DMAc), tetrahydrofuran (THF) or toluene.

The reaction process of the synthetic aromatic polyimide is as follows:

A polycondensation of an anhydride monomer with an aromatic amine monomer is performed in an aprotic polar solvent to produce an aromatic polyamic acid. A quantity of anhydride structures in the anhydride monomer is greater than or equal to 2, and a quantity of amine structures in the aromatic amine monomer is greater than or equal to 2. The anhydride monomer is preferably a dianhydride, and the aromatic amine monomer is preferably an aromatic diamine. The anhydride monomer used in the embodiment is a dianhydride

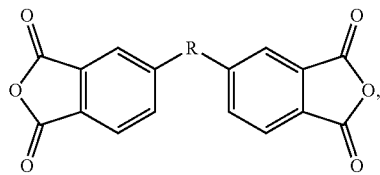

(5,5'-bis(isobenzofuran-1,3-dione)), wherein R is selected from O, S, $CH_2$, $CF_2$ or $C(CF_3)_2$. The specific examples of the aromatic diamine are, for example,

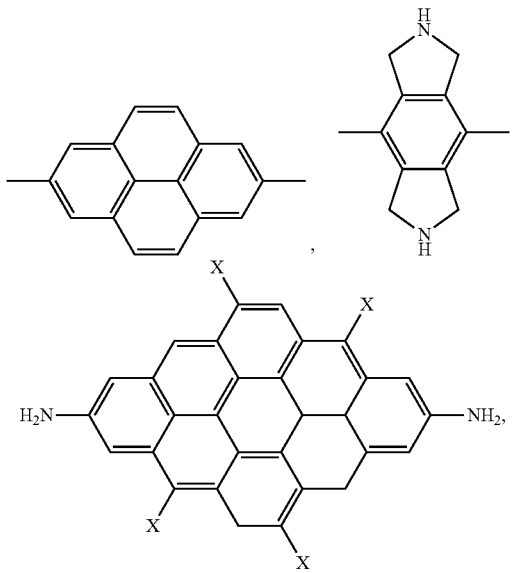

wherein X is selected from $CH_3$, $CF_3$, $CBr_3$, F, Cl or Br. The aromatic polyamic acid is heated to dehydrate and cyclize (Imidization) to produce the aromatic polyimide.

A specific method of another embodiment for providing the reflective layer 130 may also be, for example, performing a polycondensation of an anhydride monomer with an aromatic amine monomer in an aprotic polar solvent to produce an aromatic polyamic acid; and adding and mixing with a plurality of diffuse reflection particles, coating on a forming surface and performing heat curing, so that the aromatic polyamic acid is dehydrated and cyclized to produce the aromatic polyimide.

In addition, corresponding to FIG. 1A and FIG. 1B, in the step S103 of the manufacturing method of the wavelength-converting components 100, 1001, the forming surfaces coated by the reflective layer 130 are different, and further details will be explained below. Taking the wavelength-converting component 100 of FIG. 1A for example, the forming surface coated by the reflective layer 130 is, for example, the second surface 112 of the substrate 110, but is not limited thereto. Taking the wavelength-converting component 1001 of FIG. 1B for example, when the wavelength-converting layer 120 is a solid structure such as a phosphor in glass, a phosphor in ceramic, a polycrystalline fluorescent sheet, a monocrystalline fluorescent sheet or a phosphor in silicon, the forming surface may be the third surface 121 of the wavelength-converting layer 120, wherein the manufacturing method of the wavelength-converting component 1001 further includes bonding the fifth surface 131 of the reflective layer 130 to the second surface 112 of the substrate 110 by the intermediate layer 140.

In another embodiment exemplified by the wavelength-converting component 1001 of FIG. 1B, the manufacturing method of the wavelength-converting component 1001 further includes providing a pre-formed substrate (not shown in the figure). The pre-formed substrate has a seventh surface. The forming surface of the reflective layer 130 is the seventh surface of the pre-formed substrate, and the fifth surface 131 of the reflective layer 130 is joined to the seventh surface of the pre-formed substrate. Next, separating the fifth surface 131 of the reflective layer 130 from the seventh surface of the pre-formed substrate, and bonding the fifth surface 131 of the reflective layer 130 to the second surface 112 of the substrate 110 by the intermediate layer 140.

In the embodiment using the pre-formed substrate, a material of the pre-formed substrate is, for example, Teflon or metal coated with boron nitride dissolved in alcohol. By the non-stick property of the pre-formed substrate, the reflective layer 130 can be completely separated from the seventh surface of the pre-formed substrate after being formed.

Figure 6:
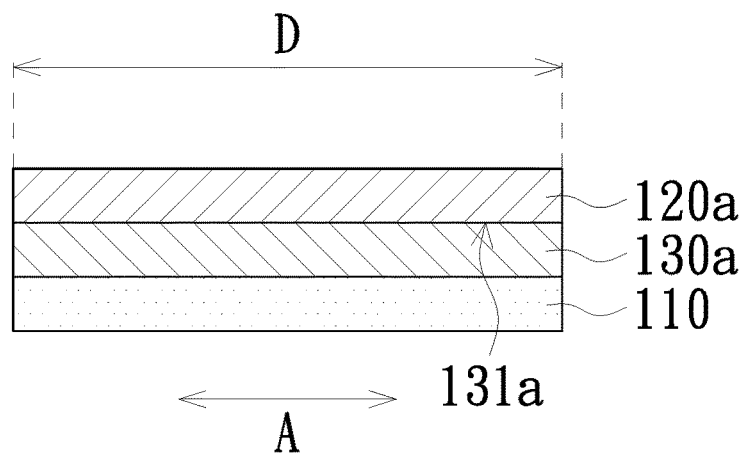
FIG. 6 is a schematic view of a wavelength-converting component according to another embodiment of the invention.
Figure 7:
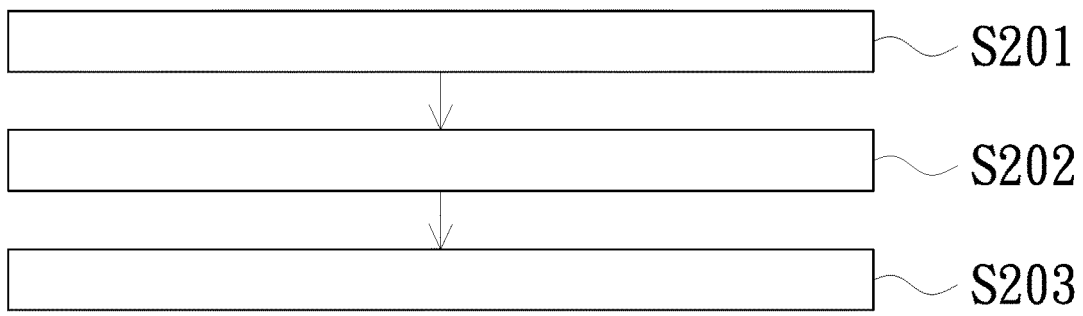
FIG. 7 is a schematic flow chart showing a manufacturing method of a wavelength-converting component according to another embodiment of the invention.

In addition to the reflective layer, the wavelength-converting layer may also be made by using an organic adhesive. FIG. 6 is a schematic view of a wavelength-converting component according to another embodiment of the invention. FIG. 7 is a schematic flow chart showing a manufacturing method of a wavelength-converting component according to another embodiment of the invention. Please refer to FIG. 6 and FIG. 7. The wavelength-converting component 100a of the embodiment is similar to the wavelength-converting component 100 in structures and advantages. The manufacturing method of the wavelength-converting component 100a of the embodiment includes the following steps: performing the step S201 to provide a substrate 110.

The step S202 is performed to provide a reflective layer 130a disposed on the substrate 110. In an embodiment, a material of the reflective layer 130a includes, for example, silver, a silver alloy, aluminum, an aluminum alloy or a dielectric. If a material of the reflective layer 130a is the metal as exemplified above, at least one of a dielectric layer and a protective layer may be additionally added, and the protective layer can protect the metal from being oxidized. In another embodiment, the reflective layer 130a may also include, for example, a plurality of diffuse reflection particles and an adhesive, and the diffuse reflection particles are mixed in the adhesive. The type of the adhesive is not particularly limited. When the adhesive is the first organic adhesive, the reflective layer 130a is the reflective layer 130.

The step S203 is performed to provide a wavelength-converting layer 120a disposed on a surface 131a of the reflective layer 130a away from the substrate 110. The wavelength-converting layer 120a includes a wavelength-converting material and a second organic adhesive. The wavelength-converting material is mixed in the second organic adhesive. The wavelength-converting material is, for example, a phosphor or quantum dots. The second organic adhesive is, for example, the first organic adhesive, but is not limited thereto. Specifically, when the wavelength-converting layer 120a uses the first organic adhesive, a specific method of an embodiment for providing the wavelength-converting layer 120a includes, for example, synthesizing an aromatic polyimide. The wavelength-converting material, the aromatic polyimide and an organic solvent are mixed and coated on the surface 131a of the reflective layer 130a away from the substrate 110, and heat curing is performed at temperatures from 200° C. to 300° C. Ingredients of the organic solvent include, for example, N-Methyl-2-Pyrrolidone (NMP), dimethylformamide (DMF), dimethylacetamide (DMAc), tetrahydrofuran (THF) or toluene. The reaction process for synthesizing the aromatic polyimide is as above, and no redundant detail is to be given herein. In addition, when the wavelength-converting layer 120a uses the first organic adhesive, a specific method of another embodiment for providing the wavelength-converting layer 120a may also be, for example, performing a polycondensation of an anhydride monomer with an aromatic amine monomer in an aprotic polar solvent to produce an aromatic polyamic acid, and the wavelength-converting material is added thereto, mixed and coated on the surface 131a of the reflective layer 130a away from the substrate 110 and heat curing is performed to dehydrate and cyclize the aromatic polyamic acid to produce the aromatic polyimide.

In order to achieve a better conversion effect of a light, the thickness of the wavelength-converting layer 120a is, for example, from 0.10 mm to 0.25 mm, and the percentage by weight of the first organic adhesive to the wavelength-converting layer 120a is, for example, from 10% to 60%.

When manufacturing the wavelength-converting components 100, 1001 and 100a, the widths D of the reflective layers 130, 130a and the wavelength-converting layers 120, 120a in the direction A parallel to the substrate 110 may be the same or different. However, in order to achieve a better diffuse reflection effect and a conversion effect, a range of the width ratio of the two is, for example, from 0.7 to 1.5. In addition, in an embodiment including the intermediate layer 140, a width D of the intermediate layer 140 in the direction A parallel to the substrate 110 is required to be greater than, for example, a width D of the reflective layer 130, so that the entire structure of the wavelength-converting component 100 is more stable after the diffuse reflective layer 130 is bonded to the substrate 110, or, the width D of the intermediate layer 140 in the direction A parallel to the substrate 110 is required to be greater than, for example, the long axis B of the light spot S (as shown in FIG. 2) to achieve the heat dissipation effect. The coating conditions in different embodiments will be exemplified below.

Figure 8A:
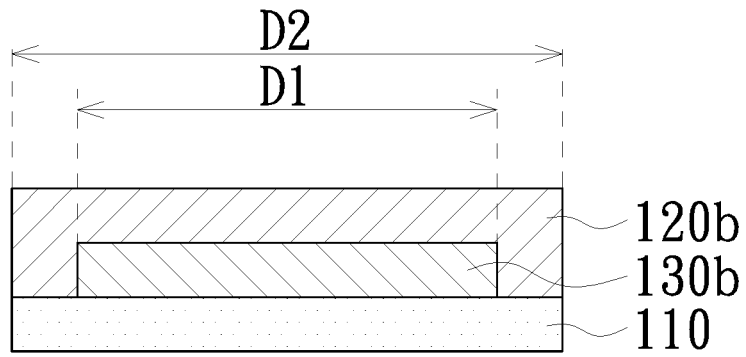
FIG. 8A is a schematic view of a wavelength-converting component according to another embodiment of the invention.
Figure 8B:
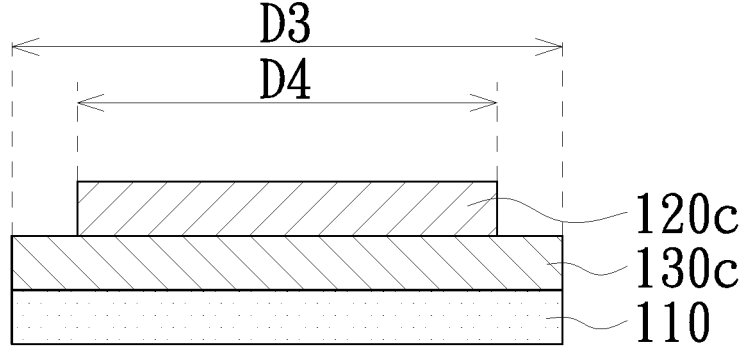
FIG. 8B is a schematic view of a wavelength-converting component according to another embodiment of the invention.

In the embodiments of FIG. 1A, FIG. 1B and FIG. 6, the reflective layers 130, 130a and the wavelength-converting layers 120, 120a have the same width D (hereinafter referred to as width) in the direction A parallel to the substrate 110. FIG. 8A is a schematic view of a wavelength-converting component according to another embodiment of the invention. FIG. 8B is a schematic view of a wavelength-converting component according to another embodiment of the invention. Please refer to FIG. 8A and FIG. 8B. In the embodiment where a width D1 of the reflective layer 130b is smaller than a width D2 of the wavelength-converting layer 120b (FIG. 8A), when providing the wavelength-converting layer 120b, the periphery of the wavelength-converting layer 120b can cover, for example, two sides of the reflective layer 130b and can be directly coated on the substrate 110, so that the wavelength-converting layer 120b can be more firmly adhered to the substrate 110, and the entire structure of the wavelength-converting component 100b is more stable. In addition, alternatively as shown in FIG. 8B, a width D3 of the reflective layer 130c is greater than a width D4 of the wavelength-converting layer 120c.

Figure 9:
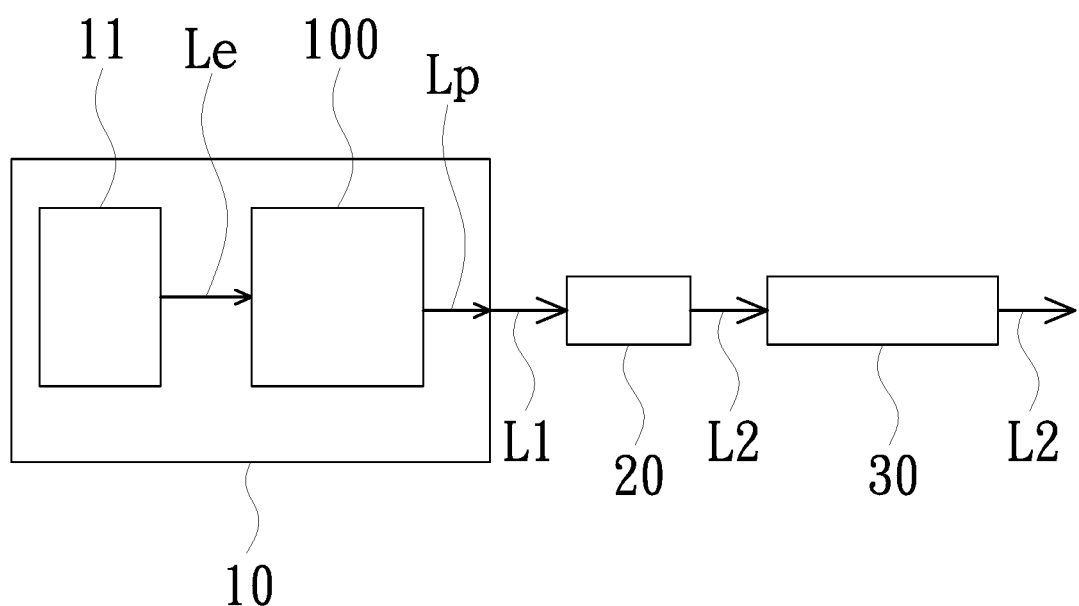
FIG. 9 is a schematic block diagram of a projection apparatus according to an embodiment of the invention.

FIG. 9 is a schematic block diagram of a projection apparatus according to an embodiment of the invention. Please refer to FIG. 9. In the embodiment, the wavelength-converting component 100 is, for example, a wavelength-converting wheel. The substrate 110 is, for example, a turntable. The projection apparatus 1 of the embodiment includes an illumination system 10, a light valve 20 and a projection lens 30. The illumination system 10 is configured to provide an illumination beam L1. The illumination system 10 includes an excitation light source 11 and the wavelength-converting component 100 (the wavelength-converting wheel). The excitation light source 11 is configured to provide an excitation beam Le. The wavelength-converting component 100 is disposed on a transmission path of the excitation beam Le, and includes the wavelength-converting layer 120 and the diffuse reflection layer 130. The wavelength-converting component 100 is configured to convert the excitation beam Le into a converted beam Lp, and the illumination beam L1 includes the converted beam Lp, but is not limited thereto. The illumination system 10 may further include other optical components, for example, a light combining component, a filter wheel, a light homogenization component and a condenser lens, so that the illumination beam L1 is transmitted to the light valve 20. The light valve 20 is disposed on the transmission path of the illumination beam L1 to convert the illumination beam L1 into an image beam L2. The light valve 20 may be a transmissive light valve or a reflective light valve, wherein the transmissive light valve may be a liquid-crystal display (LCD) panel, and the reflective light valve may be a digital micro-mirror device (DMD) or a liquid crystal on silicon (LCoS) panel. According to different design structures, a quantity of the light valve may be one or a plurality. The projection lens 30 is disposed on a transmission path of the image beam L2 and is configured to project the image beam L2 out of the projection apparatus 1.

FIG. 9 is an example of the wavelength-converting component 100 of FIG. 1A, but the wavelength-converting component 100 can be replaced with the wavelength-converting component of any of the above embodiments.

Since the projection apparatus 1 of the embodiment uses the wavelength-converting components 100, 1001, 100a, 100b, 100c with the above-mentioned improved temperature resistance and less pores (as above-mentioned, the pores affect the reflection effect and the heat conduction effect), the higher power excitation light source 11 can be used to reduce degradation in image brightness.

In summary, in the wavelength-converting component of the embodiments of the invention, the reflective layer includes the first organic adhesive and the diffuse reflection particles. The first organic adhesive includes an aromatic polyimide. Since curing temperatures of the first organic adhesive using the above formula are only from 200° C. to 300° C., compared to a curing temperature of conventional glass-based material required to be greater than 400° C., the reflective layer of the embodiment of the invention can reduce the fine pores generated by sintering at a high temperature (>400° C.) and the characteristics of easily adsorbing liquids. The curing process where the temperature is increased in stages, can improve mechanical properties such as shear strength, tensile strength and fatigue strength of entire structure of the reflective layer. In addition, chemical stability of the benzene ring structure contained in the aromatic polyimide is higher, which also contributes to the improvement of mechanical properties such as shear strength, tensile strength and fatigue strength of entire structure of the reflective layer, and can improve temperature resistance. The aromatic structure has a hydrophobic property, which can also reduce rates of moisture absorption. If the wavelength-converting layer also uses the first organic adhesive of the above formula, it also has the above advantages. The manufacturing method of the wavelength-converting component of the embodiment of the invention uses the above-mentioned first organic adhesive, and therefore the above-mentioned wavelength-converting component can be produced. The projection apparatus of the embodiments of the invention can reduce degradation in image brightness by using the above-mentioned wavelength-converting component.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims. Furthermore, the terms such as the first surface, the second surface, the first organic adhesive and the second organic adhesive are only used for distinguishing various elements and do not limit the number of the elements.

What is claimed is:

1. A wavelength-converting component, comprising:
    a substrate;
    a wavelength-converting layer, disposed on the substrate; and
    a reflective layer, disposed between the substrate and the wavelength-converting layer, the reflective layer comprises a plurality of diffuse reflection particles and a first organic adhesive, the diffuse reflection particles are mixed in the first organic adhesive, and the first organic adhesive comprises an aromatic polyimide.

2. The wavelength-converting component according to claim 1, wherein curing temperatures of the first organic adhesive are from 200° C. to 300° C.

3. The wavelength-converting component according to claim 1, wherein the wavelength-converting layer comprises a wavelength-converting material and a second organic adhesive, the wavelength-converting material is mixed in the second organic adhesive, and the second organic adhesive comprises an aromatic polyimide.

4. The wavelength-converting component according to claim 3, wherein curing temperatures of the second organic adhesive are from 200° C. to 300° C.

5. The wavelength-converting component according to claim 1, wherein the wavelength-converting component further comprises an intermediate layer disposed between the substrate and the reflective layer.

6. The wavelength-converting component according to claim 5, wherein a thermal conductivity of the reflective layer is less than or equal to a thermal conductivity of the intermediate layer.

7. The wavelength-converting component according to claim 1, wherein the wavelength-converting layer comprises a wavelength-converting material and an inorganic adhesive, the wavelength-converting material is mixed in the inorganic adhesive, and the inorganic adhesive comprises at least one of a glass paste, a water glass and a silica gel.

8. The wavelength-converting component according to claim 1, wherein the wavelength-converting layer comprises a phosphor in glass, a phosphor in ceramic, a polycrystalline fluorescent sheet, a monocrystalline fluorescent sheet or a phosphor in silicon.

9. A projection apparatus, comprising:
an illumination system, configured to provide an illumination beam, wherein the illumination system comprises:
    an excitation light source, configured to provide an excitation beam; and
    a wavelength-converting component, disposed on a transmission path of the excitation beam, wherein the wavelength-converting component is configured to convert the excitation beam into a converted beam, the illumination beam comprises the converted beam, and the wavelength-converting component comprises:
        a substrate;
        a wavelength-converting layer, disposed on the substrate; and
        a reflective layer, disposed between the substrate and the wavelength-converting layer, wherein the reflective layer comprises a plurality of diffuse reflection particles and a first organic adhesive, the diffuse reflection particles are mixed in the first organic adhesive, and the first organic adhesive comprises an aromatic polyimide;
a light valve, disposed on a transmission path of the illumination beam to convert the illumination beam into an image beam; and
a projection lens, disposed on a transmission path of the image beam.

* * * * *